US008682253B2

(12) United States Patent
Tsuji et al.

(10) Patent No.: US 8,682,253 B2
(45) Date of Patent: Mar. 25, 2014

(54) RADIO COMMUNICATION SYSTEM, SLAVE UNIT, MASTER UNIT AND COMMUNICATION METHOD

(75) Inventors: Daisuke Tsuji, Toyonaka (JP); Shinichi Mukaigawa, Kyoto (JP)

(73) Assignee: Omron Corporation, Kyoto-shi (JP)

( * ) Notice: Subject to any disclaimer, the term of this patent is extended or adjusted under 35 U.S.C. 154(b) by 1100 days.

(21) Appl. No.: 12/042,807

(22) Filed: Mar. 5, 2008

(65) Prior Publication Data

US 2008/0242333 A1 Oct. 2, 2008

(30) Foreign Application Priority Data

Mar. 30, 2007 (JP) ................................ 2007-092313

(51) Int. Cl.
*H04B 17/00* (2006.01)
*H03C 1/62* (2006.01)

(52) U.S. Cl.
USPC .................................... 455/67.11; 455/115.1

(58) Field of Classification Search
USPC ............. 455/67.11, 67.12, 67.16, 41.2, 41.3, 455/41.1, 418, 419, 420, 18, 242.1, 242.2, 455/243.1, 550.1, 90.1, 115.1
See application file for complete search history.

(56) References Cited

U.S. PATENT DOCUMENTS

| | | | |
|---|---|---|---|
| 5,517,345 A * | 5/1996 | Joaille | 398/112 |
| 7,231,200 B2 * | 6/2007 | Jenkins | 455/404.1 |
| 2006/0087405 A1 | 4/2006 | Koike et al. | |

FOREIGN PATENT DOCUMENTS

| | | |
|---|---|---|
| CN | 1766945 A | 5/2006 |
| JP | 6-284213 A | 10/1994 |
| JP | 7-302159 A | 11/1995 |
| JP | 2000-132765 A | 5/2000 |
| JP | 2003-030773 | 1/2003 |
| JP | 2004-341648 | 12/2004 |
| JP | 2005-244284 A | 9/2005 |
| JP | 2006-041758 A | 2/2006 |
| JP | 2006-279292 A | 10/2006 |

* cited by examiner

*Primary Examiner* — Eugene Yun
(74) *Attorney, Agent, or Firm* — Foley & Lardner LLP

(57) ABSTRACT

The invention provides a radio communication system allowing a user to readily set a delay time. The controller determines whether the test button was depressed and then determines how long the test button has been kept depressed. The depressed time is set as a delay time and stored in a memory. After a lapse of the set delay time, the controller starts a communication with a master unit, determines whether the installation site of the slave unit 10 is appropriate and notifies the determination. If a normal communication is recognized from the determination result, the user decides to install the slave unit to the tested installation site and terminates the test.

6 Claims, 2 Drawing Sheets

RADIO COMMUNICATION SYSTEM, SLAVE UNIT, MASTER UNIT AND COMMUNICATION METHOD

This application claims priority from Japanese Patent Application 2007-092313, filed on Mar. 30, 2007. The entire content of the aforementioned application is incorporated herein by reference.

BACKGROUND OF THE INVENTION

1. Field of the Invention

This invention relates to a radio communication system comprising a slave unit and a master unit, the slave unit and a communication method. In particular, this invention relates to a radio communication system, a slave unit, a master unit and a communication method in which the slave unit detects predetermined data and the master unit collects the data detected by the slave unit.

2. Description of Background Art

Conventional radio communication systems including a slave unit and master unit are disclosed, for example, in Japanese unexamined patent publication Nos. 2004-341648 and 2003-30773. The radio communication system in patent publication No. 2004-341648 includes a slave unit provided with an operating section for a communication test that transmits a test radio wave to a master unit. The transmission of the test radio wave is operated by the operating section to be delayed so that the test radio wave is transmitted after a door of a pipe shaft or the like is closed.

On the other hand, patent publication No. 2003-30773 discloses that a radio slave unit operates an external signal detection section therein and transmits data after a lapse of a delay time, and the delay time can be set to a desired value.

The conventional radio communication systems including the slave unit and master unit have the above-described structure and are capable of delaying the transmission of the test radio wave from the slave unit and setting the delay time; however, there is no specific description of the setting method of the delay time, and therefore the way of setting the delay time is unknown.

SUMMARY OF THE INVENTION

The present invention is made in view of the above problem and has an object to provide a radio communication system with a slave unit and master unit, allowing users to readily set a delay time or the like, the slave unit used therein and the communication method.

The radio communication system according to the present invention includes a slave unit that detects predetermined data, and a master unit that can communicate with the slave unit by radio and collects the data transmitted from the slave unit. The slave unit includes a transmission button that provides an instruction to transmit the data to the master unit and a control section that controls the change of the transmission method of the data to the master unit depending on how the transmission button is depressed.

With the slave unit capable of changing the transmission method to the master unit depending on how the transmission button is depressed, it is possible to set the delay time according to the installation situation of the slave unit.

Consequently, it is possible to provide a radio communication system allowing users to more readily set the delay time or the like, the slave unit used in the radio communication system and the communication method.

Preferably, the control section changes the transmission method of the data to the master unit according to the depressed time of the transmission button.

More preferably, the control section controls the delay time before transmitting the data to the master unit according to the depressed time of the transmission button.

According to another aspect of the present invention, a slave unit transmits predetermined data to a master unit. The slave unit includes a transmission button that provides an instruction to transmit the data to the master unit and a control section that controls the change of the transmission method of the data to the master unit depending on how the transmission button is depressed.

Preferably, the control section controls the delay time before transmitting the data to the master unit according to the depressed time of the transmission button.

According to yet another aspect of the present invention, the communication method is performed by a slave unit to transmit predetermined data to a master unit. The communication method including a step of recognizing the depression of the transmission button for providing an instruction to transmit the data to the master unit and a step of changing the delay time before initiating the transmission of the data to the master unit depending on how the transmission button is depressed.

According to yet another aspect of the present invention, the master unit used in the above-described radio communication system collects the data transmitted from the slave unit.

DESCRIPTION OF PREFERRED EMBODIMENT

Figure 1:
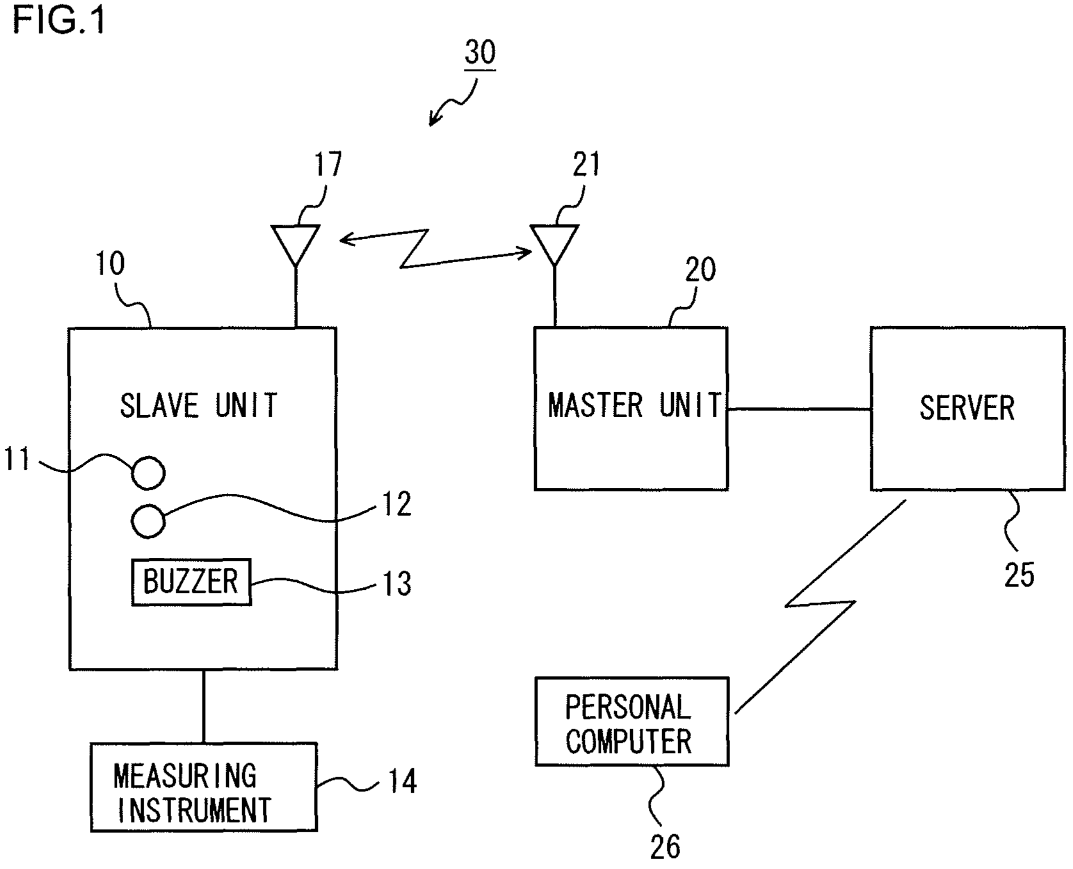
FIG. 1 is a block diagram showing the entire structure of a radio communication system according to an embodiment of the invention.

With reference to the drawings, an embodiment of the present invention will be described below. FIG. 1 is a block diagram showing the structure of a radio communication system according to the embodiment. Referring to FIG. 1, the radio communication system 30 includes a slave unit 10 that is connected to a predetermined measuring instrument 14 or other instrument and transmits data obtained from the measuring instrument 14, a master unit 20 that receives the data transmitted from the slave unit 10, and a server 25 that is connected by a wire like a public line to the master unit 20 and stores the data. The data transmitted from the slave unit 10 can be browsed by accessing the server 25 through an Internet network or the like from a personal computer 26.

The slave unit 10 has an enclosure whose front surface has a test button 11 used to determine whether the slave unit 10 can communicate with the master unit 20 before the installation of the slave unit 10, an indicator light 12 made of an LED or the like, a buzzer 13, an antenna 17 and other components. The measuring instrument connected to the slave unit 10 may be an electricity meter, a gas meter, or a thermometer. The data may be analog data or digital data. The measuring instrument 14 may be integral with the slave unit 10. The test button 11 serves as a transmission button.

The indicator light 12 is provided to indicate the status of the communication with the master unit 20 by blinking or other ways. The buzzer 13 sounds an alert in the event that the communication level with the master unit 20 is lower than a predetermined value or in the other cases, as described later. The master unit 20 includes an antenna 21 for communicating with the slave unit 10 by radio.

Figure 2:
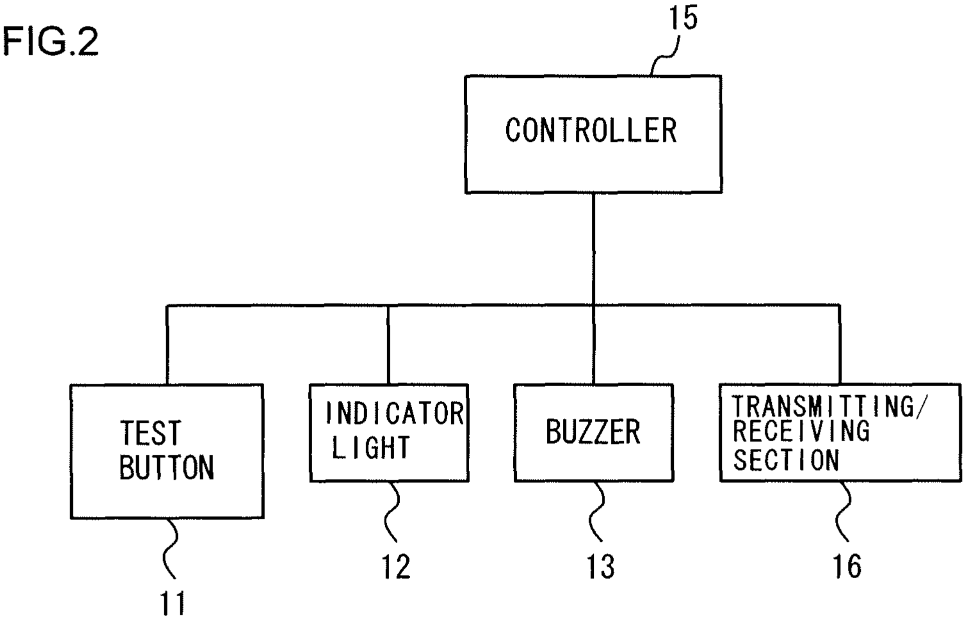
FIG. 2 is a block diagram showing main components of a slave unit.

FIG. 2 is a block diagram showing main components of the slave unit 10. Referring to FIG. 2, the slave unit 10 includes a controller 15 controlling the entire slave unit 10. The test button 11, indicator light 12, buzzer 13, and a radio transmitting/receiving section 16 including the antenna 17 are controlled by the controller 15.

Next, a description will be made about the operations of the controller 15 when the slave unit 10 is installed. The slave unit 10 is generally placed in an enclosure such as a control panel or a meter box, or in a pipe space, on the back side of a door, which is an entrance of the enclosure such as the pipe space, or the like. The pipe space is a storage space of a collection of plumbing components for gas facilities, water supply/drainage equipment, etc. For the slave unit 10 installed in such places, the test button 11, which is provided to let a user know whether the slave unit 10 can normally communicate with the master unit 20, is depressed to make a communication with the master unit 20, and the installation site of the slave unit 10 is determined based on the result. In the case where the slave unit 10 is mounted on the back side of the door as described above, if the salve unit 10 starts communication with the master unit 20 immediately after the depression of the test button 11, the test communication is performed with the door open. The door is generally made of metal that affects communication and therefore the open door makes the result different from an actual installation state, that is, a state where the door is closed. This is unfavorable. To prevent this, in this embodiment, the start time of the communication with the master unit 20 can be delayed depending on how the test button 11 is depressed. Specifically, in this embodiment, the depressed time of the test button 11 is set as a delay time before starting the communication with the master unit 20. For example, if the test button 11 is depressed for 10 seconds, the communication with the master unit 20 starts in 10 seconds.

Figure 3:
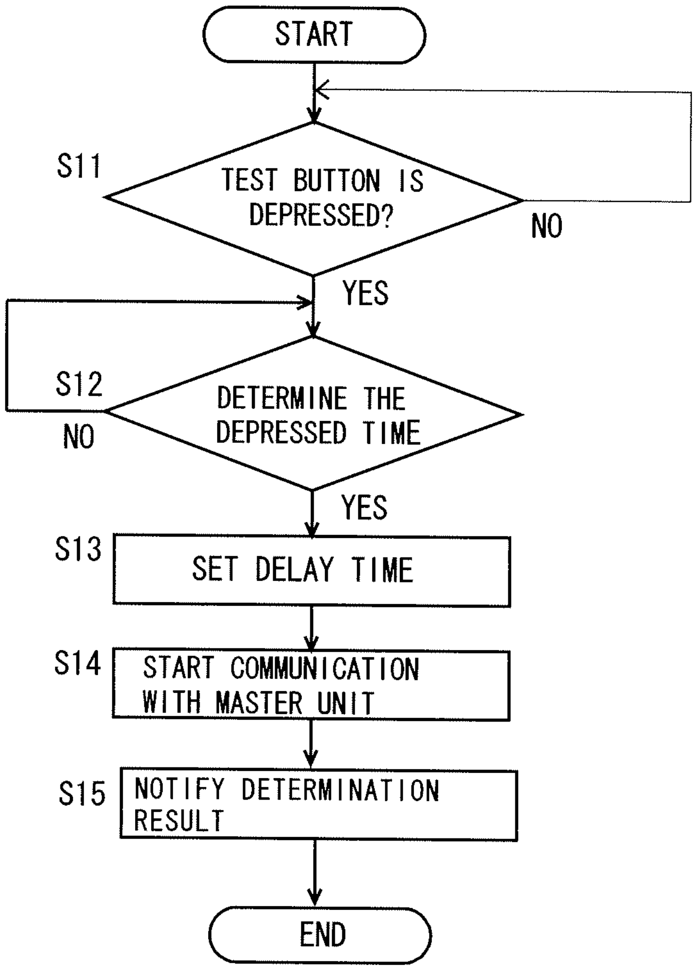
FIG. 3 is a flow chart illustrating operations performed by a controller of the slave unit.

FIG. 3 is a flow chart illustrating operations of the controller 15. Referring to FIG. 3, the controller 15 determines whether the test button 11 was depressed or not (step S11, hereinafter, "step" is omitted), and determines how long the test button 11 has been depressed (S12). The depressed time is set as a delay time and stored in a memory (not shown) (S13). After a lapse of the set delay time, the communication with the master unit 20 starts (S14). More specifically, the slave unit 10 transmits a test command or the like to the master unit 20. The controller 15 determines whether the communication is normally made, that is, whether the installation site is appropriate for the slave unit 10, depending on the reply from the master unit 20.

The determination can be made by whether the reply is transmitted from the master unit 20 or by whether the communication level, that is, the strength of the radio wave goes beyond a predetermined threshold. The user is notified of the determination result by the buzzer 13 (S15). Specifically, the notification of the determination result is made with the presence or absence of a beep, or different pitch, timbre or sound pattern of the buzzer. The indicator light 12 also can give the result, however the beep by the buzzer is more preferable because the slave unit 10 may often be mounted where the user cannot directly observe, for example, on the inside of the door.

If normal communication is recognized from the determination result, the user decides to install the slave unit 10 at the tested position and terminates the test. If normal communication is not recognized, the user makes an adjustment, including a change of the position of the slave unit 10 and restarts the test. In short, the operations shown in the flow chart of FIG. 3 are performed from the beginning once again. The adjustment is made by changing the installation site of the slave unit 10 because this is easy and has general applicability; however, it is also possible to change the installation site of the master unit 20 or to modify the pipe space or the like, for example by making a hole in the door of the pipe space.

As described above, the delay time can be changed according to the depressed time of the test button 11 in this embodiment, and the delay time can be set to any length of time depending on where the slave unit 10 is installed. For example, if the slave unit 10 is installed on the back side of a door and it takes 10 seconds to close the door and start a test, the delay time can be set at 10 seconds by maintaining depression of the test button for 10 seconds. Alternatively, if the slave unit 10 is installed outside and is ready to make communication immediately, the only thing to do is to just depress the test button 11 and release it quickly.

Although the delay time can be changed according to how long the test button is kept depressed in the embodiment, the invention is not limited to this. It is possible to set the delay time to a desired length of time by various ways of depressing the test button, for example, by intermittently pushing the button or pushing the button at evenly spaced time intervals.

It is also possible to not only set the delay time but also to change the transmission method of the data to the master unit depending on how the button is depressed.

The foregoing has described the embodiment of the present invention by referring to the drawings. However the invention should not be limited to the illustrated embodiment. It should be appreciated that various modifications and changes can be made to the illustrated embodiment within the scope of the appended claims and their equivalents.

What is claimed is:

1. A radio communication system comprising:

a slave unit configured to detect predetermined data; and a master unit configured to communicate with said slave unit by radio and configured to collect the data transmitted from said slave unit, wherein said slave unit is connected to a predetermined measuring instrument and is configured to transmit data obtained from the predetermined measuring instrument to said master unit and includes:

a single transmission button configured to provide an instruction to transmit the data to said master unit; and a control section configured to set a delay time for transmitting the data to the master unit before transmitting the data to the master unit, wherein said control section is configured to change the delay time according to the depressed time of said transmission button.

2. The radio communication system according to claim 1, wherein said slave unit further includes an indicator light to indicate the status of the communication with said master unit.

3. The radio communication system according to claim 1, wherein said slave unit further includes a buzzer to notify the communication level with said master unit.

4. The radio communication system according to claim 1, wherein said slave unit is installed at a backside of a door of an enclosure.

5. A slave unit transmitting predetermined data to a master unit comprising:

a predetermined measuring instrument connected to the slave unit and configured to transmit predetermined data obtained from the predetermined instrument to the master unit;

a single transmission button configured to provide an instruction to transmit the data to said master unit; and a control section configured to set a delay time for transmitting the data to the master unit before transmitting the data to the master unit, wherein said control section is configured to change the delay time according to the depressed time of said transmission button.

6. A communication method performed by a slave unit to transmit predetermined data to a master unit, comprising:

a step of recognizing the depression of a single transmission button of the slave unit for providing an instruction to transmit the data to said master unit;

a step of obtaining data from a predetermined instrument connected to the slave unit and transmitting the obtained data to the master unit;

a step of changing a delay time for transmitting the data to the master unit before initiating the transmission of the data transmission to said master unit according to the depressed time of said single transmission button.

* * * * *